(12) United States Patent
Buciumas

(10) Patent No.: US 11,934,894 B2
(45) Date of Patent: Mar. 19, 2024

(54) CLIENT DEVICE WITH SIMULATED EDGE NODE FOR ACCESSING A DISTRIBUTED STORAGE SYSTEM

(71) Applicant: Truist Bank, Charlotte, NC (US)

(72) Inventor: Sergiu Buciumas, Kennesaw, GA (US)

(73) Assignee: Truist Bank, Charlotte, NC (US)

( * ) Notice: Subject to any disclaimer, the term of this patent is extended or adjusted under 35 U.S.C. 154(b) by 27 days.

(21) Appl. No.: 17/888,927

(22) Filed: Aug. 16, 2022

(65) Prior Publication Data

US 2024/0061728 A1 Feb. 22, 2024

(51) Int. Cl.
G06F 9/44 (2018.01)
G06F 9/54 (2006.01)
G06F 30/20 (2020.01)

(52) U.S. Cl.
CPC .............. *G06F 9/542* (2013.01); *G06F 30/20* (2020.01)

(58) Field of Classification Search
CPC ...................................................... G06F 9/542
USPC .......................................................... 719/328
See application file for complete search history.

(56) References Cited

U.S. PATENT DOCUMENTS 10,796,035 B1 * 10/2020 Xia .................... G06F 30/18
11,513,866 B1 * 11/2022 Cnudde ................ G06F 9/5083
2017/0235846 A1 * 8/2017 Atlas ..................... H04L 67/535

* cited by examiner

*Primary Examiner* — Timothy A Mudrick
(74) *Attorney, Agent, or Firm* — Kilpatrick Townsend & Stockton LLP; Michael A. Springs, Esq.

(57) ABSTRACT

Some examples of the present disclosure involve a client device configured to execute a simulated edge node. The simulated edge node can simulate an edge node of a distributed storage system. The distributed storage system can be configured to receive requests for performing file operations from external client devices via an application programming interface (API). The simulated edge node can receive a request for performing a file operation from a software program and, in response, facilitate execution of the file operation by exposing at least a portion of a file system of the distributed storage system to the software program using one or more access mechanisms other than the API.

20 Claims, 4 Drawing Sheets

CLIENT DEVICE WITH SIMULATED EDGE NODE FOR ACCESSING A DISTRIBUTED STORAGE SYSTEM

TECHNICAL FIELD

The present disclosure relates generally to distributed storage systems. More specifically, but not by way of limitation, this disclosure relates to a simulated edge node that can allow a client device to access a distributed storage system, for example using access mechanisms other than an application programming interface (API) of the distributed storage system.

BACKGROUND

A distributed storage system can include a cluster of nodes (e.g., physical machines) in communication with each other over a network for synchronizing, coordinating, and storing data. The nodes can work together so that the distributed storage system behaves as one storage system. Distributed storage systems can provide improved scalability, redundancy, and performance over conventional storage systems. For example, distributed storage systems can be easily scaled horizontally, in the sense that they can combine many worker nodes into a single, shared storage system. Distributed storage systems can also store many copies of the same data for high availability, backup, and disaster-recovery purposes.

One popular type of distributed storage system is Hadoop. Hadoop's distributed file system (HDFS) architecture employs three types of nodes: master nodes, worker nodes, and edge nodes. A master node can control which worker nodes perform which tasks and what processes run on what worker nodes. One type of master node in Hadoop is a "NameNode." A NameNode can manage access to the files, including reads, writes, creates, deletes and the data block replication across the worker nodes. The NameNode can also keep track of where file data is kept in the cluster. In contrast to a master node, a worker node can store the data and perform computations. One type of worker node in Hadoop is a "DataNode." DataNodes can store file data as a set of blocks within the Hadoop environment. DataNodes can also service read and write requests from client devices. An edge node can be a gateway for end users to communicate with other nodes in the distributed storage system. In the context of Hadoop, the purpose of the edge node is to provide client devices with an access point to the Hadoop cluster while preventing them from directly connecting to other components, such as the NameNode or DataNodes, for security reasons. In this way, the edge node can serve as an interface between the Hadoop cluster and an outside network. Other types of distributed storage systems may also include similar types and arrangements of nodes.

Some distributed storage systems can include an application programming interface that is built into the distributed storage system. The application programming interface may be a centralized interface for communicating with client devices. The distributed storage system can receive requests (e.g., read, write, and delete requests) from client devices via the application programming interface and respond to the requests by transmitting data and other information back to the client devices via the application programming interface. In some cases, the application programming interface can include one or more predefined functions.

SUMMARY

One example of the present disclosure includes a client device comprising a processor and a memory. The memory can include instructions that are executable by the processor for causing the processor to: execute a software program configured to transmit a request for performing a file operation; and execute a simulated edge node configured to simulate an edge node of a distributed storage system that is separate from the client device, the distributed storage system being configured to receive requests for performing file operations from external client devices via an application programming interface (API), and the simulated edge node being configured to receive the request and facilitate execution of the file operation by exposing at least a portion of a file system of the distributed storage system to the software program using one or more access mechanisms other than the API.

Another example of the present disclosure includes a method comprising executing a software program configured to transmit a request for performing a file operation; and executing a simulated edge node configured to simulate an edge node of a distributed storage system that is separate from the client device, the distributed storage system being configured to receive requests for performing file operations from external client devices via an application programming interface (API), and the simulated edge node being configured to receive the request and facilitate execution of the file operation by exposing at least a portion of a file system of the distributed storage system to the software program using one or more access mechanisms other than the API. Some or all of the above operations can be implemented by a client device.

Still another example of the present disclosure can include a non-transitory computer-readable medium comprising program code that is executable by a processor of a client device for causing the processor to: execute a software program configured to transmit a request for performing a file operation; and execute a simulated edge node configured to simulate an edge node of a distributed storage system that is separate from the client device, the distributed storage system being configured to receive requests for performing file operations from external client devices via an application programming interface (API), and the simulated edge node being configured to receive the request and facilitate execution of the file operation by exposing at least a portion of a file system of the distributed storage system to the software program using one or more access mechanisms other than the API.

DETAILED DESCRIPTION

Figure 1:
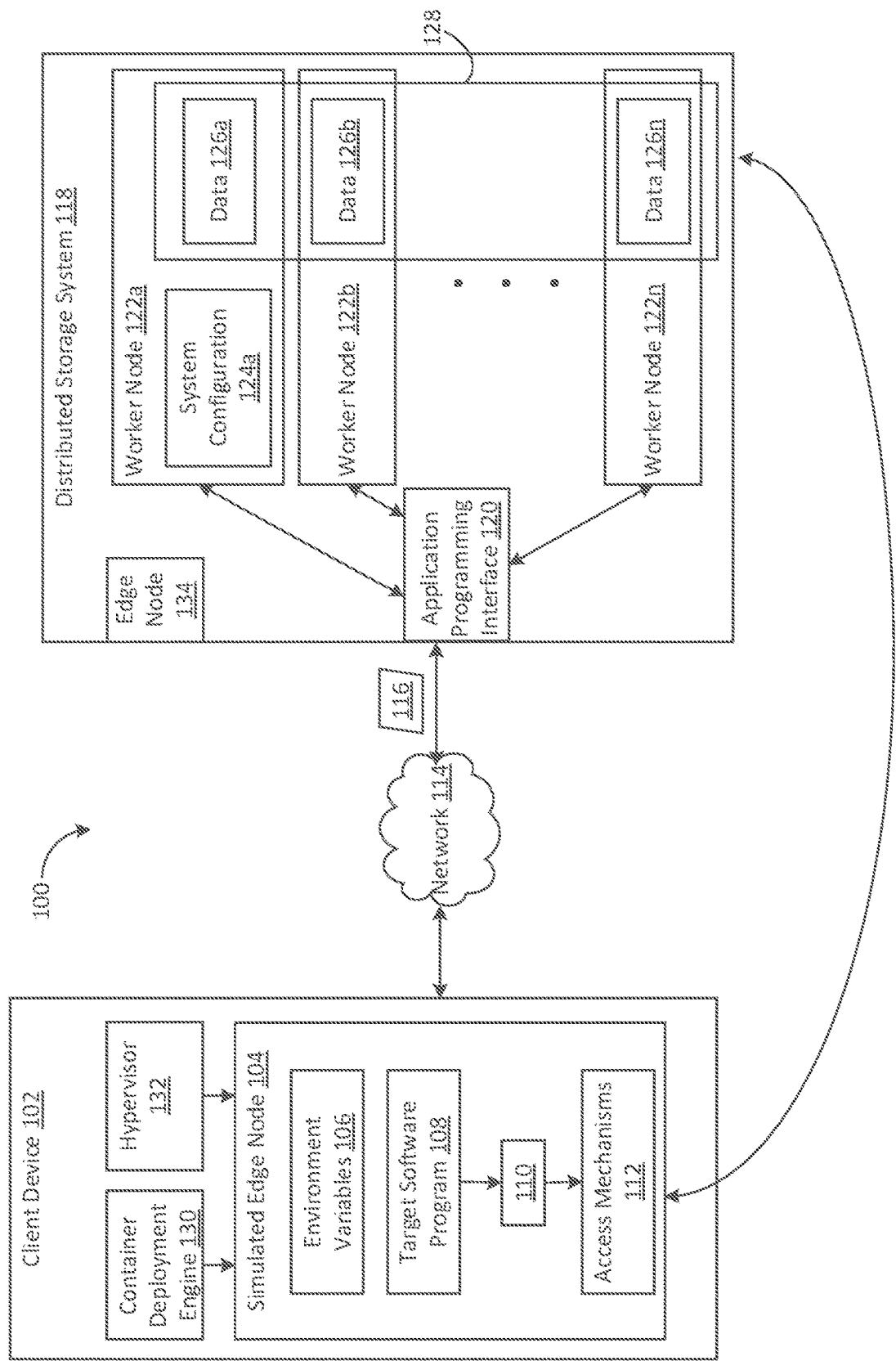
FIG. 1 shows a block diagram of an example of a system for providing a client device with access to a distributed storage system via a simulated edge node according to some aspects of the present disclosure.

Certain aspects and features of the present disclosure relate to a client device that can execute a simulated edge node configured to allow a software program to engage in file operations (e.g., read, write, and delete operations) on a distributed storage system, for example without involving an application programming interface of the distributed storage system. The simulated edge node can be a software emulation of an edge node of the distributed storage system. The client device can deploy and configure the simulated edge node based on configuration data from the distributed storage system. Once the simulated edge node is deployed, it can employ various types of access mechanisms such as remote procedure calls and in-memory processing to expose at least a portion of the distributed storage system's file system to a software program running on the client device. This can allow the software program (e.g., a software program or service) to perform the file operations using the distributed storage system, without having to go through the application programming interface of the distributed storage system.

Many distributed storage systems include an application programming interface for communicating with external client devices. But these application programming interfaces are often services that expose files to client devices using the hypertext transfer protocol. This can introduce numerous problems, one of which is that it can impose size constraints on file transfers. Because the hypertext transfer protocol was not designed to transfer large files (e.g., movies), transfers of large files using the application programming interface may sometimes stall or fail altogether. To avoid these issues, a network administrator may configure the application programming interface to impose a size limit on file transfers, so that files greater than the size limit are rejected. While this may prevent file transfers from stalling or failing, it does so at the expense of large files. As a result of these size limits, the distributed storage system may be unable to be used in a variety of circumstances that involve large files.

Some examples of the present disclosure can overcome one or more of the abovementioned problems by allowing a client device to perform file operations with respect to a distributed storage system by using a simulated edge node (e.g., rather than the distributed storage system's application programming interface). The client device can deploy the simulated edge node, which can employ various access mechanisms to circumvent the application programming interface. Using these access mechanisms, the simulated edge node can provide a "pathway" around the application programming interface to, for example, allow the client device to read, write, and delete data in the distributed storage system. This pathway may not rely on the hypertext transfer protocol, so it may not impose the same size limits and other constraints as the application programming interface. Using the simulated edge node, large files (e.g., files greater than 100 megabytes) can be more easily transferred and other file operations can be more easily performed than by using the application programming interface.

These illustrative examples are given to introduce the reader to the general subject matter discussed here and are not intended to limit the scope of the disclosed concepts. The following sections describe various additional features and examples with reference to the drawings in which like numerals indicate like elements but, like the illustrative examples, should not be used to limit the present disclosure.

FIG. 1 shows a block diagram of an example of a system 100 for providing a client device 102 with access to a distributed storage system 118 via a simulated edge node 104 according to some aspects of the present disclosure. More specifically, the system 100 can include a client device 102. Examples of the client device 102 can include a laptop computer, desktop computer, mobile telephone, e-reader, server, or tablet. The client device 102 can be external to the distributed storage system 118 and communicatively coupled to the distributed storage system 118 via a network 114, such as the Internet.

The distributed storage system 118 can include any number of worker nodes 122a-n (e.g., storage nodes) for use in storing data, performing computations, or both. In the context of Hadoop, the worker nodes 122a-n may be DataNodes. Each of the worker nodes 122a-n may be a physical machine with a processor, a memory, and a storage device. Together, the worker nodes 122a-n may produce a distributed file system 128 that can include any amount and combination of data 126a-n. The distributed storage system 118 may also include one or more other types of nodes, such as master nodes and edge nodes 134. In the context of Hadoop, the master nodes may be NameNodes.

In the example shown in FIG. 1, the distributed storage system 118 further includes an application programming interface 120. The application programming interface 120 may be prebuilt into the distributed storage system 118 and serve as the default mechanism through which external client devices can interact with the distributed storage system 118. For example, the client devices can execute software programs that can issue requests (e.g., read, write, and delete requests) to the application programming interface 120. The distributed storage system 118 can receive the requests at the application programming interface 120 and service the requests using one or more of the worker nodes 122a-n. As one particular example, the client device 102 may issue a write request to the application programming interface 120 for writing data (e.g., data 126a) to the distributed file system 128 of the distributed storage system 118. To effectuate the write request, the distributed storage system 118 may receive the write request and the corresponding data via the application programming interface 120 and store the data on one or more of the worker nodes 122a-n. As another example, the client device 102 may issue a read request to the application programming interface 120 for reading data from the distributed storage system 118. To effectuate the read request, the distributed storage system 118 may receive the read request at the application programming interface 120 and transfer the data from one or more of the worker nodes 122a-n back to the client device 102 via the application programming interface 120.

Using the application programming interface 120 to facilitate file operations may be suitable in some situations. But in other situations, the application programming interface 120 may impose constraints (e.g., file size limitations) that may be overly prohibitive. It may therefore be desirable in some situations to circumvent the application programming interface 120 when performing file operations. It may further be desirable to circumvent the application programming interface 120 without changing the configuration (e.g., the hardware or software configuration) of the distributed storage system 118, for example by installing additional components like a file transfer protocol server. This is because it may be expensive, time consuming, and complex to install the additional components in the distributed storage system 118, and running the additional components may consume power and computing resources.

To help achieve one or more of the above objectives, in some examples the client device 102 can use a simulated edge node 104. The simulated edge node 104 can be configured to simulate an edge node 134 of the distributed storage system 118, in the sense that the simulated edge node 104 can be configured to mimic the functional capabilities of a real edge node 134 of the distributed storage system 118. But, the simulated edge node 104 may be distinct from a real edge node 134 in various ways. For example, the simulated edge node 104 can be located on the client device 102, rather than within the distributed storage system 118. The simulated edge node 104 may also be configured to only serve as a gateway for the client device 102 on which it is running, and no other client devices. In contrast, a real edge node 134 may be configured to serve as a gateway for some or all of the client devices that connect to the distributed storage system 118. The process for deploying and using the simulated edge node 104 is as follows.

The client device 102 can begin by receiving configuration data 116 relating to the distributed storage system 118. In some examples, the client device 102 can transmit a request for the configuration data 116 to the distributed storage system 118, for example to the application programming interface 120. The distributed storage system 118 can respond to the request by providing the configuration data 116 to the client device 102, for example via the application programming interface 120. The configuration data 116 may include configuration files for the distributed storage system 118 (e.g., Hadoop cluster config files), binaries for the distributed storage system 118 (e.g., Hadoop binaries), a system configuration 124a of a worker node 122a, or any combination of these. The system configuration 124a can describe the hardware configuration, software configuration, and runtime-environment variables associated with the worker node 122a. The distributed storage system 118 can collect the configuration data 116 by interacting with the worker node 122a and/or other nodes of the distributed storage system 118.

After receiving the configuration data 116, the client device 102 can deploy a simulated edge node 104 based on the configuration data 116. In some examples, the simulated edge node 104 may be a container that is at least partially configured using the configuration data 116. For example, the client device 102 can deploy a container on a host operating system of the client device 102 using a container deployment engine 130, such as Docker®, LXC Linux Containers, or Podman. A container is a relatively isolated virtual environment created by leveraging the resource isolation features (e.g., cgroups and namespaces) of the Linux Kernel. The container can be deployed from an image file, sometimes referred to as a container image, using the container deployment engine 130. The container image can include libraries and other software such that, once a container is deployed therefrom, the container can have similar functional capabilities to a real edge node 134 of the distributed storage system 118. In other examples, the simulated edge node 104 may be a virtual machine that is at least partially configured using the configuration data 116. For example, the client device 102 can deploy a virtual machine on a host operating system of the client device 102 using a hypervisor 132, such as Oracle® VM VirtualBox, Microsoft® Virtual PC, and Kernel-based Virtual Machine (KVM). The virtual machine can be deployed from an image file, sometimes referred to as a virtual machine image, using the hypervisor 132. The virtual machine image can include libraries and other software such that, once a virtual machine is deployed therefrom, the virtual machine can have similar functional capabilities to a real edge node 134 of the distributed storage system 118.

Deploying the simulated edge node 104 can involve launching the simulated edge node 104 and configuring the simulated edge node 104 based on the configuration data 116. For example, the simulated edge node 104 may be a container deployed from a container image using the container deployment engine 130. The container may have a set of environment variables 106 or other properties with values that can be configured (e.g., selected and set) based on the configuration data 116. This may provide the simulated edge node 104 with certain functional capabilities that mimic an edge node of the distributed storage system 118. As another example, the simulated edge node 104 may be a virtual machine deployed from a virtual machine image using a hypervisor 132. The virtual machine may have a set of environment variables 106 or other properties with values that can be configured based on the configuration data 116. This may provide the simulated edge node 104 with certain functional capabilities that mimic an edge node of the distributed storage system 118.

After the simulated edge node 104 is deployed, the simulated edge node 104 can communicate with the distributed storage system 118 via the network 114. For example, the simulated edge node 104 may authenticate with the distributed storage system 118 to obtain access to the distributed file system 128. This may involve connecting to the distributed storage system 118 via one or more secure protocols such as secure shell protocol (SSH)); providing authentication credentials such as a username and password to the distributed storage system 118; providing one or more digital certificates such as a Kerberos certificate to the distributed storage system 118 for authentication; or any combination of these. Once authenticated, the simulated edge node 104 may be granted access to the distributed storage system 118.

The client device 102 can also deploy a target software program 108, such as a software program or service. The target software program 108 can be any suitable type of software program that is configured to perform one or more file operations (e.g., using the distributed storage system 118). For example, the target software program 108 can include a game, a utility application, data-processing service, a machine-learning service, a cybersecurity tool, or the like. In some examples, the target software program 108 may be a native application, for example an Android application or an iOS application. Different companies or developers can create the target software program than the simulated edge node 104, because the target software program 108 is designed to implement different functionality than the simulated edge node 104.

In some examples, the target software program 108 may be deployed inside the simulated edge node 104. For example, if the simulated edge node 104 includes a container, the program code for the target software program 108 can be included in the container image for the simulated edge node 104. As a result, the container deployment engine 130 can automatically deploy the target software program 108 within the isolated context of the container when the container deployment engine 130 deploys the container. As another example, if the simulated edge node 104 includes a virtual machine, the program code for the target software program 108 can be included in the virtual machine image for the simulated edge node 104. As a result, the hypervisor 132 can automatically deploy the target software program 108 within the isolated context of the virtual machine when the hypervisor 132 deploys the virtual machine.

Once running, the target software program 108 can issue requests 110 for performing file operations. Examples of the requests 110 can include read requests for reading content (e.g., reading data from files), write requests for writing content (e.g., writing data to files), create requests for creating content (e.g., files and directories), and delete requests for deleting content. The simulated edge node 104 can receive the requests 110 and interact with the distributed storage system 118 via the network 114 to facilitate the corresponding file operations.

For example, the simulated edge node 104 can expose a portion of the distributed file system 128 to the target software program 108 using access mechanisms 112 other than the application programming interface 120. The access mechanisms 112 may include multiple different types of access mechanisms, such as remote procedure calls and in-memory processing technologies like Apache® Arrow. The internal nodes (e.g., worker nodes 122a-n) of the distributed storage system 118 may also employ the same or similar access mechanisms to perform various internal functions for the distributed storage system 118, such as computations, data replication, and data migration. Because the simulated edge node 104 is configured to function similarly to an edge node of the distributed storage system 118, and because the simulated edge node 104 has been configured based on the configuration data 116, the simulated edge node 104 may be able to leverage the same or similar access mechanisms used by the internal nodes of the distributed storage system 118. In doing so, the simulated edge node 104 can expose at least a portion of the distributed file system 128 to the target software program 108 for use in performing the file operations. In this way, the simulated edge node 104 can allow the target software program 108 to perform one or more file operations on the distributed storage system 118, for example while circumventing the application programming interface 120 as represented by a dashed arrow in FIG. 1.

In some examples, the exposed portion of the distributed file system 128 can appear as a local file system to the target software program 108. For example, the exposed portion of the distributed file system 128 may appear as a local file system within the isolated context of the container or virtual machine of the simulated edge node 104. That local file system can be different from the underlying file system of the host operating system on which the container or virtual machine is executing. As a result, the target software program 108 may be unaware that it is interacting with a remote distributed storage system 118 via a network 114. In this way, the simulated edge node 104 can operate in a transparent manner to the target software program 108 to facilitate file operations on the distributed storage system 118.

The particular portion of the distributed file system 128 that is exposed to the target software program 108 can depend on the authorization level granted to the simulated edge node 104 based on the authentication process. This particular portion can be referred to as an authorized portion, because it is the portion of the distributed file system 128 that the simulated edge node 104 is authorized to access. For example, the particular portion that is exposed to the target software program 108 may be only a limited subpart (e.g., an active directory) of the overall distributed file system 128, where the limited subpart is dependent on an authentication level associated with the client device 102.

As alluded to above, the simulated edge node 104 can serve as an intermediary between the target software program 108 and the distributed storage system 118. In some examples, the simulated edge node 104 can use its position as an intermediary between the target software program 108 and the distributed storage system 118 for translating between their data formats. For example, the target software program 108 may rely on a first data format and the distributed storage system 118 can rely on a second data format. So, the simulated edge node 104 can receive data from the target software program 108 in the first format and translate the data to the second format before transmitting the data to the distributed storage system 118. Likewise, the simulated edge node 104 can receive data from the distributed storage system 118 in the second format and translate the data to the first format before providing the data to the target software program 108. This translation can occur transparently to one or both parties, for example so that neither is aware that the simulated edge node 104 is performing the translation. By performing these translations, the simulated edge node 104 may improve interoperability and allow for a larger number of software programs to be used with the distributed storage system 118 than may otherwise be possible.

Although FIG. 1 shows a certain number and arrangement of components, this is intended to be illustrative and non-limiting. Other examples may include more components, fewer components, different components, or a different arrangement of components than is shown in FIG. 1. For instance, other examples may involve multiple client devices 102 connected to the distributed storage system 118 via the network 114, where the multiple client devices 102 can include simulated edge nodes 104 as described above.

Figure 2:
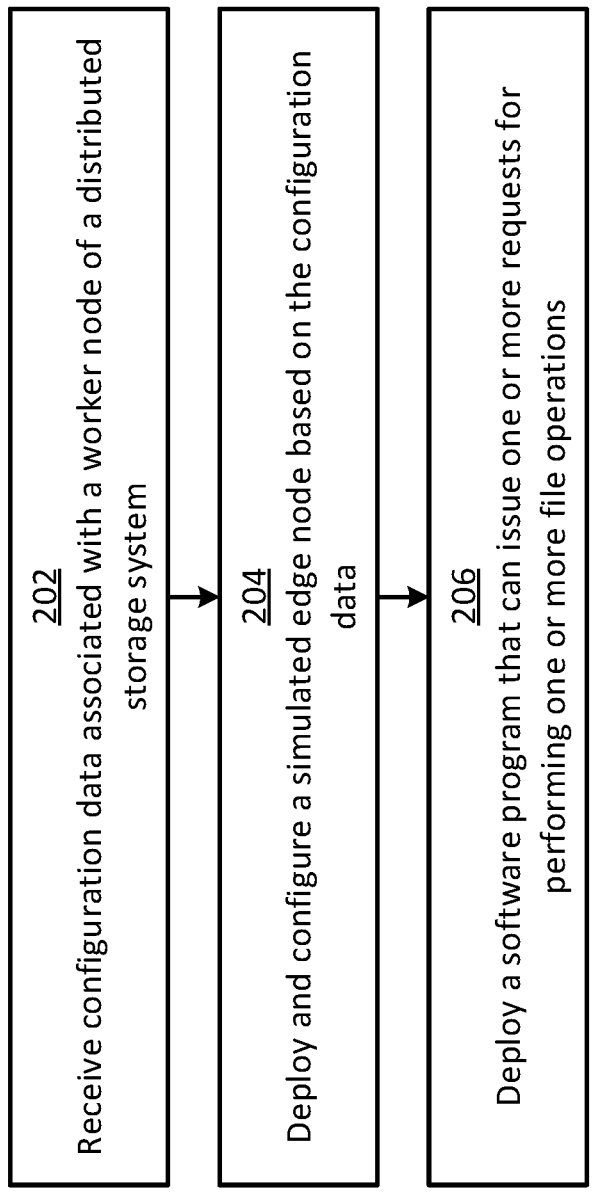
FIG. 2 shows a flow chart of an example of a process implemented by a client device according to some aspects of the present disclosure.

FIG. 2 shows a flow chart of an example of a process implemented by a client device according to some aspects of the present disclosure. Other examples may involve more operations, fewer operations, different operations, or a different order of the operations than is shown in FIG. 2. The operations of FIG. 2 are described below with reference to the components of FIG. 1 above.

In block 202, the client device 102 receives configuration data 116 associated with a worker node 122a of a distributed storage system 118. The client device 102 can receive the configuration data 116 from the distributed storage system 118 or a third party that is different from the distributed storage system 118. The client device 102 can receive the configuration data 116 via a network 114, in some examples.

In block 204, the client device 102 deploys and configures a simulated edge node 104 based on the configuration data 116. For example, the client device 102 can deploy the simulated edge node 104 as a container and configure its environment variables based on the configuration data 116, so that the environment variables of the container have similar values to that of the worker node 122a. As another example, the client device 102 can deploy the simulated edge node 104 as a virtual machine and configure its environment variables based on the configuration data 116, so that the environment variables of the virtual machine have similar values to that of the worker node 122a. This may allow the simulated edge node 104 to leverage the same or similar access mechanisms 112 that are available to the worker node 122a. The simulated edge node 104 can be deployed from an image file, such as a container image or a virtual machine image.

In block 206, the client device 102 deploys a software program 108. The client device 102 can deploy the software program 108 directly on its host environment or inside an isolated guest environment running on top of the host environment. For example, the client device 102 can deploy the software program 108 inside a container or a virtual machine, which can be associated the simulated edge node 104 and running on the host operating system. This may allow the software program 108 to function as if it is executing on a real edge node 134 of the distributed storage system 118. Once deployed, the software program 108 can issue one or more requests 110 for performing file operations. The requests 110 may be intercepted and/or facilitated by the simulated edge node 104.

Figure 3:
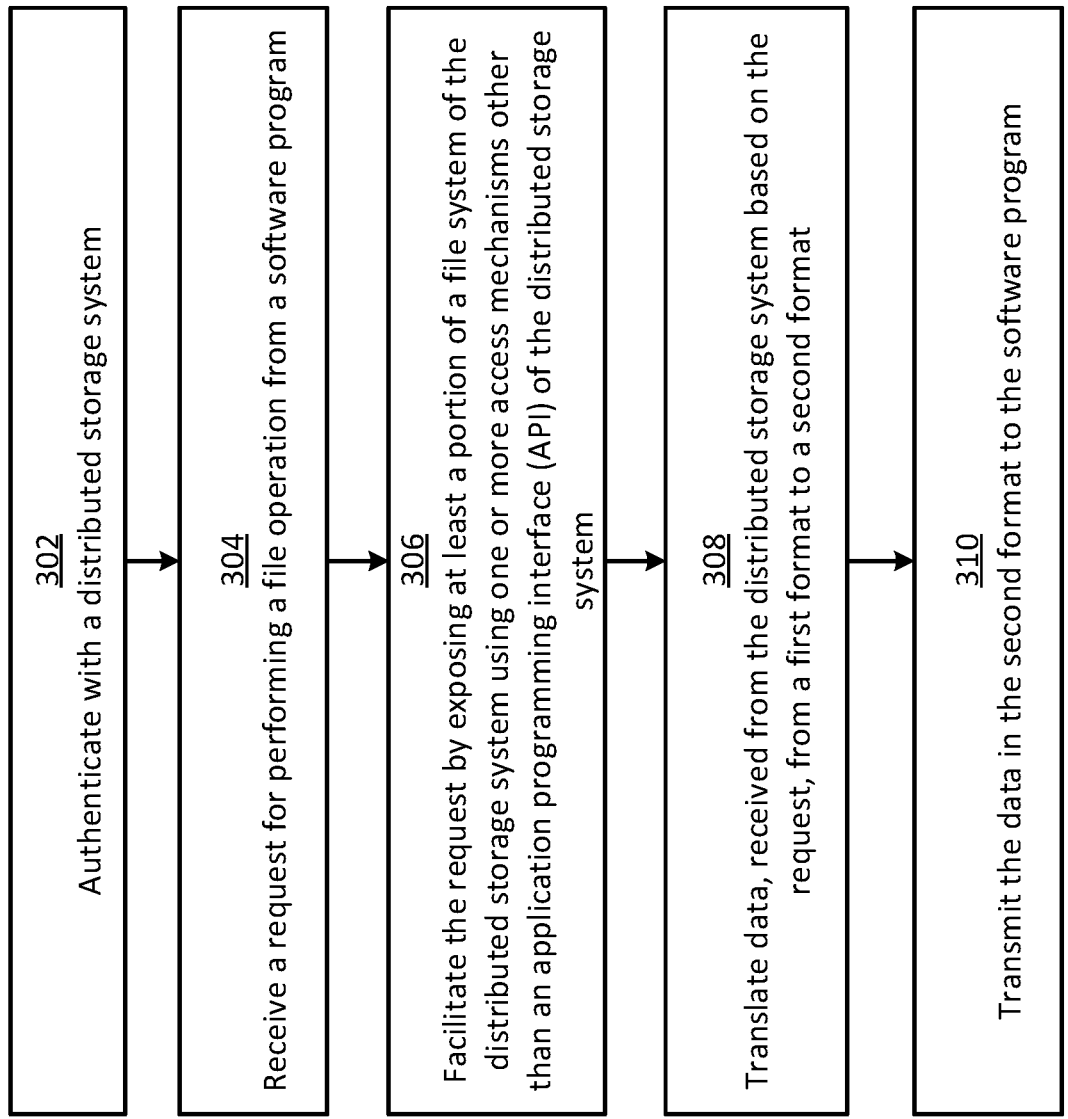
FIG. 3 shows a flow chart of an example of a process implemented by a simulated edge node according to some aspects of the present disclosure.

FIG. 3 shows a flow chart of an example of a process implemented by a simulated edge node according to some aspects of the present disclosure. Other examples may involve more operations, fewer operations, different operations, or a different order of the operations than is shown in FIG. 3. The operations of FIG. 3 are described below with reference to the components of FIG. 1 above.

In block 302, the simulated edge node 104 authenticates with a distributed storage system 118. For example, the simulated edge node 104 can connect to the distributed storage system 118 vi a network 114 and transmit authentication credentials such as a pin code or encrypted secret to the distributed storage system 118. Additionally or alternatively, the simulated edge node 104 can provide a digital certificate to the distributed storage system 118 for authentication purposes.

In block 304, the simulated edge node 104 receives a request 110 for performing a file operation from a software program 108. The request 110 may be a read request for performing a read operation, a write request for performing a write operation, a delete request for performing a delete operation, or a creation request for performing a create operation.

The software program 108 can execute on the same physical machine (e.g., the client device 102) as the simulated edge node 104. In some examples, the software program 108 can execute within the simulated edge node 104. In some such examples, the software program 108 can issue the request 110 in relation to what it perceives to be a local file system within the relatively isolated context of the simulated edge node 104. The local file system may, however, correspond to at least a portion (e.g., an authorized portion) of a distributed file system 128 of the distributed storage system 118 that is exposed to the software program 108 by the simulated edge node 104.

In block 306, the simulated edge node 104 facilitates the request 110 by exposing at least a portion of a file system of the distributed storage system 118 using one or more access mechanisms 112 other than an application programming interface (API) 120 of the distributed storage system 118. The file system may be the distributed file system 128 described above. In some examples, the access mechanisms 112 may include multiple different types of access mechanisms. For instance, the access mechanisms 112 can include can include one or more inter-process communication protocols and one or more data-sharing technologies, which may be designed for facilitating reading and writing of data between local nodes of a distributed computing system. Using these access mechanisms 112, the simulated edge node 104 can expose at least a portion of the distributed storage system's file system to the software program 108 as if it was local to the software program 108. The software program 108 may therefore be unaware that it is actually interacting with a remote distributed storage system 118.

In block 306, the simulated edge node 104 translates data, received from the distributed storage system 118 based on the request 110, from a first format to a second format. For example, the software program 108 can issue a read request 110 for reading data 126a from the distributed storage system 118. Based on the request 110, the distributed storage system 118 can provide the data 126a back to the simulated edge node 104 in a first format. The simulated edge node 104 can translate the data 126a from the first format (e.g., a JSON format) into a second format (e.g., YAML format), which may be more suitable or compatible with the software program 108. In some examples, the simulated edge node 104 can perform this translation using an algorithm or a predefined lookup table. Such a lookup table may, for example, include a mapping between a first set of statements in the first format and a second set of statements in the second format.

In block 310, the simulated edge node 104 provides the data 126a in the second format to the software program 108. For example, the simulated edge node 104 can store the data 126a in the second format in a memory location accessible to the software program 108 or otherwise expose the data 126a to the software program 108.

Figure 4:
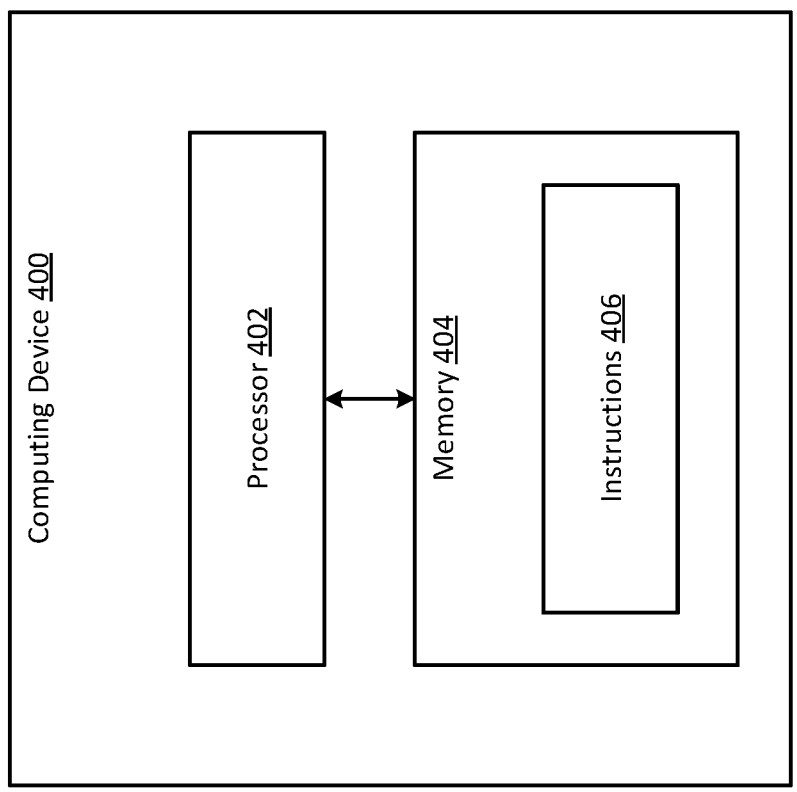
FIG. 4 shows a block diagram of a computing device usable for implementing some aspects of the present disclosure.

FIG. 4 shows a block diagram of a computing device 400 usable for implementing some aspects of the present disclosure. For example, the computing device 400 can serve as the client device 102 or a worker node 122 of FIG. 1.

The computing device 400 includes a processor 702 coupled to a memory 404 via a bus. The processor 402 can include one processing device or multiple processing devices. Non-limiting examples of the processor 402 include a Field-Programmable Gate Array (FPGA), an application-specific integrated circuit (ASIC), a microprocessor, or any combination of these. The processor 402 can execute instructions 406 stored in the memory 404 to perform operations. Examples of such operations can include any of the operations described above with respect to the client device 102, such as the operations relating to the simulated edge node 104 and the software program 108. In some examples, the instructions 406 can include processor-specific instructions generated by a compiler or an interpreter from code written in any suitable computer-programming language, such as C, C++, C #, Python, or Java.

The memory 404 can include one memory device or multiple memory devices. The memory 404 can be volatile or non-volatile, such that the memory 404 retains stored information when powered off. Non-limiting examples of the memory 404 include electrically erasable and programmable read-only memory (EEPROM), flash memory, or any other type of non-volatile memory. At least some of the memory device can include a non-transitory computer-readable medium from which the processor 402 can read instructions 406. A computer-readable medium can include electronic, optical, magnetic, or other storage devices capable of providing the processor 402 with computer-readable instructions or other program code. Non-limiting examples of a computer-readable medium can include magnetic disks, memory chips, ROM, random-access memory (RAM), an ASIC, a configured processor, optical storage, or any other medium from which a computer processor can read the instructions 406.

The computing device 400 may also include other input and output (I/O) components, which are not shown here for simplicity. The input components can include a mouse, a keyboard, a trackball, a touch pad, a touch-screen display, or any combination of these. The output components can include a visual display, an audio display, a haptic display, or any combination of these. Examples of a visual display can include a liquid crystal display (LCD), a light-emitting diode (LED) display, and a touch-screen display. An example of an audio display can include speakers. Examples of a haptic display may include a piezoelectric device or an eccentric rotating mass (ERM) device.

The above description of certain examples, including illustrated examples, has been presented only for the purpose of illustration and description and is not intended to be exhaustive or to limit the disclosure to the precise forms disclosed. Modifications, adaptations, and uses thereof will be apparent to those skilled in the art without departing from the scope of the disclosure. For instance, any examples described herein can be combined with any other examples.

The invention claimed is:

1. A client device, comprising:
a processor; and
a memory including instructions that are executable by the processor for causing the processor to:
execute a software program configured to transmit a request for performing a file operation; and
execute a simulated edge node configured to simulate an edge node of a distributed storage system that is separate from the client device, the distributed storage system being configured to receive requests for performing file operations from external client devices via an application programming interface (API), and the simulated edge node being configured to receive the request and facilitate execution of the file operation by exposing at least a portion of a file system of the distributed storage system to the software program using one or more access mechanisms other than the API.

2. The client device of claim 1, wherein the memory further includes instructions that are executable by the processor for causing the processor to, prior to executing the simulated edge node:
receive configuration data from the distributed storage system, wherein the configuration data describes a system configuration of a worker node in the distributed storage system; and
configure the simulated edge node based on the configuration data.

3. The client device of claim 2, wherein the memory further includes instructions that are executable by the processor for causing the processor to:
deploy the simulated edge node as a container on the client device, the container having environment variables with values configured based on the configuration data; and
deploy the software program inside the container, wherein the simulated edge node is configured to expose an authorized portion of the file system to the software program using the one or more access mechanisms other than the API, to facilitate execution of the file operation.

4. The client device of claim 1, wherein the file operation is a read operation for reading data from the distributed storage system, a write operation for writing data to the distributed storage system, or a delete operation for deleting data from the distributed storage system.

5. The client device of claim 1, wherein the simulated edge node is configured to, prior to receiving the request for the software program:
connect to the distributed storage system via a network, the client device being external to the distributed storage system; and
authenticate with the distributed storage system to obtain access to the distributed storage system.

6. The client device of claim 1, wherein the one or more access mechanisms include a plurality of different types of access mechanisms, and the plurality of different types of access mechanisms include remote procedure calls and in-memory processing technologies.

7. The client device of claim 1, wherein the request is a read request and the file operation is a read operation for reading data from the distributed storage system, wherein the simulated edge node is configured to:
receive the data from the distributed storage system in a first format;
convert the data from the first format to a second format, the second format being different from the first format; and
provide the data in the second format to the software program for use by the software program.

8. A method comprising:
executing, by a client device, a software program configured to transmit a request for performing a file operation; and
executing, by the client device, a simulated edge node configured to simulate an edge node of a distributed storage system that is separate from the client device, the distributed storage system being configured to receive requests for performing file operations from external client devices via an application programming interface (API), and the simulated edge node being configured to receive the request and facilitate execution of the file operation by exposing at least a portion of a file system of the distributed storage system to the software program using one or more access mechanisms other than the API.

9. The method of claim 8, further comprising, prior to executing the simulated edge node:
receiving configuration data from the distributed storage system, wherein the configuration data describes a system configuration of a worker node in the distributed storage system; and
configuring the simulated edge node based on the configuration data.

10. The method of claim 9, further comprising:
deploying the simulated edge node as a container or a virtual machine on the client device, the container having environment variables with values configured based on the configuration data; and
deploying the software program inside the container or the virtual machine, wherein the simulated edge node is configured to expose an authorized portion of the file system to the software program using the one or more access mechanisms other than the API, to facilitate execution of the file operation.

11. The method of claim 8, wherein the file operation is a read operation for reading data from the distributed storage system, a write operation for writing data to the distributed storage system, or a delete operation for deleting data from the distributed storage system.

12. The method of claim 8, wherein the simulated edge node, prior to receiving the request for the software program:
connects to the distributed storage system via a network, the client device being external to the distributed storage system; and
authenticates with the distributed storage system to obtain access to the distributed storage system.

13. The method of claim 8, wherein the one or more access mechanisms include a plurality of different types of access mechanisms, and the plurality of different types of access mechanisms include remote procedure calls and in-memory processing technologies.

14. The method of claim 8, wherein the request is a read request and the file operation is a read operation for reading data from the distributed storage system, wherein the simulated edge node:
receives the data from the distributed storage system in a first format;

converts the data from the first format to a second format, the second format being different from the first format; and provides the data in the second format to the software program for use by the software program.

15. A non-transitory computer-readable medium comprising program code that is executable by a processor of a client device for causing the processor to:

execute a software program configured to transmit a request for performing a file operation; and execute a simulated edge node configured to simulate an edge node of a distributed storage system that is separate from the client device, the distributed storage system being configured to receive requests for performing file operations from external client devices via an application programming interface (API), and the simulated edge node being configured to receive the request and facilitate execution of the file operation by exposing at least a portion of a file system of the distributed storage system to the software program using one or more access mechanisms other than the API.

16. The non-transitory computer-readable medium of claim 15, further comprising program code that is executable by the processor for causing the processor to, prior to executing the simulated edge node:

receive configuration data that describes a system configuration of a worker node in the distributed storage system; and configure the simulated edge node based on the configuration data.

17. The non-transitory computer-readable medium of claim 15, further comprising program code that is executable by the processor for causing the processor to:

deploy the simulated edge node as a container or a virtual machine on the client device, the container having environment variables with values configured based on predefined configuration data; and deploy the software program inside the container or the virtual machine, wherein the simulated edge node is configured to expose an authorized portion of the file system to the software program using the one or more access mechanisms other than the API, to facilitate execution of the file operation.

18. The non-transitory computer-readable medium of claim 15, wherein the file operation is a read operation for reading data from the distributed storage system, or a write operation for writing data to the distributed storage system.

19. The non-transitory computer-readable medium of claim 15, further comprising program code that is executable by the processor for causing the simulated edge node to, prior to receiving the request for the software program:

connect to the distributed storage system via a network; and authenticate with the distributed storage system to obtain access to the distributed storage system.

20. The non-transitory computer-readable medium of claim 15, wherein the one or more access mechanisms include a plurality of different types of access mechanisms, and the plurality of different types of access mechanisms include remote procedure calls and in-memory processing technologies.

* * * * *